(12) United States Patent
Li et al.

(10) Patent No.: US 8,218,339 B2
(45) Date of Patent: Jul. 10, 2012

(54) POWER CONVERTER HAVING SYNCHRONOUS RECTIFIER AND CONTROL METHOD OF SYNCHRONOUS RECTIFIER

(75) Inventors: Han Li, Shanghai (CN); Gang Liu, Shanghai (CN); Jing Chen, Shanghai (CN); Jinfa Zhang, Shanghai (CN)

(73) Assignee: Delta Electronics, Inc., Taoyuan Hsien (TW)

( * ) Notice: Subject to any disclaimer, the term of this patent is extended or adjusted under 35 U.S.C. 154(b) by 142 days.

(21) Appl. No.: 12/848,436

(22) Filed: Aug. 2, 2010

(65) Prior Publication Data

US 2011/0038182 A1 Feb. 17, 2011

(30) Foreign Application Priority Data

Aug. 12, 2009 (TW) ................................ 98127174 A

(51) Int. Cl.
*H02M 3/335* (2006.01)
(52) U.S. Cl. ...................... 363/21.06; 363/21.14; 363/84
(58) Field of Classification Search .................... 363/16, 363/20, 21.01, 21.06, 21.09, 21.14, 81, 84, 363/127
See application file for complete search history.

(56) References Cited

U.S. PATENT DOCUMENTS

| 6,947,297 | B2* | 9/2005 | Ke et al. ........................... 363/20 |
| 7,158,392 | B2* | 1/2007 | Hosokawa et al. ......... 363/21.06 |
| 7,791,910 | B2* | 9/2010 | Pwu et al. .................. 363/21.14 |
| 2007/0115700 | A1* | 5/2007 | Springett ........................ 363/24 |
| 2007/0165429 | A1* | 7/2007 | Selvaraju et al. ............... 363/53 |

* cited by examiner

*Primary Examiner* — Adolf Berhane
(74) *Attorney, Agent, or Firm* — Kirton McConkie; Evan R. Witt

(57) ABSTRACT

Disclosed is a power converter including a switching circuit; a transformer having a primary winding connected to the switching circuit and a secondary winding; a main control circuit connected to the switching circuit for outputting a main control signal to manipulate the switching circuit; at least one synchronous rectifier connected to the secondary winding; at least one current transformer connected to the synchronous rectifier for outputting a detecting signal according to a current flowing through the synchronous rectifier; and at least one synchronous rectification control circuit connected to a control terminal of the synchronous rectifier, the current transformer, and a control terminal of the switching circuit for receiving the detecting signal and the main control signal for manipulating the synchronous rectifier. In case that the main control circuit manipulates the switching circuit to turn on, the synchronous rectification control circuit manipulates the synchronous rectifier to turn on, and thereby allowing the synchronous rectification control circuit to manipulate the synchronous rectifier to turn off according to the detecting signal.

21 Claims, 10 Drawing Sheets

POWER CONVERTER HAVING SYNCHRONOUS RECTIFIER AND CONTROL METHOD OF SYNCHRONOUS RECTIFIER

FIELD OF THE INVENTION

The present invention is related to a power converter, and more particularly to a power converter having a synchronous rectifier and using a current transformer to detect the turn-off time of the synchronous rectifier and a control method of the synchronous rectifier.

BACKGROUND OF THE INVENTION

Power converter circuits, for example, resonant power converters, basically include switching circuits, transformers, and rectifying diodes. In a conventional resonant power converter, the switching circuit is connected to a primary winding of the transformer and is regulated by a control circuit to turn on or off. The transformer is configured to receive electric energy through its primary winding and transfer the received electric energy to its secondary winding by electromagnetic inductance. The rectifying diodes are connected to the secondary winding of the transformer for rectifying the AC voltage induced across the secondary winding into a DC voltage, thereby powering a load by the rectified DC voltage.

Nonetheless, the forward-conducting voltage drop across the rectifying diodes will cause a considerable conduction loss for rectifying diodes. Consequently, the synchronous rectifier that is implemented by transistors had replaced the rectifying diodes in a power converter. Compared to conventional power converters using rectifying diodes, the power converters using synchronous rectifiers can reduce the power loss significantly.

Despite that fact that the power loss of the power converters can be decreased by employing a synchronous rectifier to perform power rectification, a precise control mechanism is required to ensure the accurate turn-on and turn-off of the synchronous rectifier that is implemented solely by transistors. The contemporary control mechanism for the synchronous rectifier is accomplished by a control integrated circuit to control the turn-on and turn-off of the synchronous rectifier. In addition, the control integrated circuit is able to sample the voltage difference between the drain terminal and the source terminal of the synchronous rectifier to calculate the current flowing through the synchronous rectifier, thereby manipulating the synchronous rectifier to turn off.

Nonetheless, the aforesaid control mechanism is subjected to the leakage inductance on the circuitry of the power converter. The effect arising from the leakage inductance would prohibit the control integrated circuit from accurately sampling the voltage difference between the drain terminal and the source terminal of the synchronous rectifier, and would further prohibit the control integrated circuit from accurately manipulating the synchronous rectifier. Such circumstances would result in the fallout that the synchronous rectifier may be turned off in advance. In this way, the synchronous rectifier is prone to be burnt down and the overall efficiency of the power converter is deteriorated.

Therefore, it is an imminent tendency to develop a power converter and a control method applied to the synchronous rectifier of the power converter such that the aforesaid deficiencies and disadvantages can be addressed.

SUMMARY OF THE INVENTION

It is therefore an object of the invention to provide a power converter having a synchronous rectifier and a control method of the synchronous rectifier. The power converter proposed by the invention is capable of removing the problems encountered by using a control integrated circuit that the operation of the synchronous rectifier can not be accurately manipulated due to the leakage inductance on the circuitry of the power converter. Furthermore, the power converter of the invention can eliminate the hazard that the synchronous rectifier might burn down and reinforce the overall efficiency of the power converter.

To this end, a broader aspect of the invention is related to a power converter, including a switching circuit for receiving an input voltage; a transformer having a primary winding and a secondary winding, in which the primary winding is connected to a power output terminal of the switching circuit; a main control circuit connected to a control terminal of the switching circuit for generating at least one main control signal to manipulate the switching circuit, thereby transferring the energy of the input voltage to the secondary winding by the switching circuit; at least one synchronous rectifier connected in series with the secondary winding of the transformer and a second common node; at least one current transformer connected in series with the synchronous rectifier for outputting a detecting signal according to a current flowing through the synchronous rectifier; and at least one synchronous rectification control circuit connected to a control terminal of the synchronous rectifier, the current transformer, and the control terminal of the switching circuit for receiving the detecting signal and the main control signal and manipulating the synchronous rectifier. More specifically, when the main control circuit manipulates the switching circuit to turn on, the synchronous rectification control circuit manipulates the synchronous rectifier to turn on, and manipulates the synchronous rectifier to turn off according to the detecting signal.

To this end, another broader aspect of the invention is related to a control method for at least one synchronous rectifier to control a power converter, in which the power converter includes a switching circuit, a main control circuit, a transformer, at least one current transformer, and at least one synchronous rectification control circuit. The switching circuit is connected to a primary winding of the transformer and the main control circuit is connected to a control terminal of the switching circuit. The current transformer and the synchronous rectifier are connected in series with a secondary winding of the transformer, and the synchronous rectification control circuit is connected to the control terminal of the switching circuit and the control terminal of the synchronous rectifier. The control method according to the invention includes the steps of:

(a) enabling the transformer to conduct energy transformation by generating and outputting a main control signal to the switching circuit and the synchronous rectification control circuit by the main control circuit, thereby manipulating the switching circuit to transfer the input energy across the transformer;

(b) manipulating the synchronous rectifier to turn on by the synchronous rectification control circuit according to the main control signal;

(c) detecting a current flowing through the synchronous rectifier by the current transformer and transmitting a detecting signal to the synchronous rectification control circuit; and (d) manipulating the synchronous rectifier to turn off by the synchronous rectification control circuit according to the detecting signal.

Now the foregoing and other features and advantages of the present invention will be best understood through the following descriptions with reference to the accompanying drawings, wherein:

DETAILED DESCRIPTION OF THE PREFERRED EMBODIMENT

Several preferred embodiments embodying the features and advantages of the present invention will be expounded in following paragraphs of descriptions. It is to be realized that the present invention is allowed to have various modification in different respects, all of which are without departing from the scope of the present invention, and the description herein and the drawings are to be taken as illustrative in nature, but not to be taken as limitative.

Figure 1:
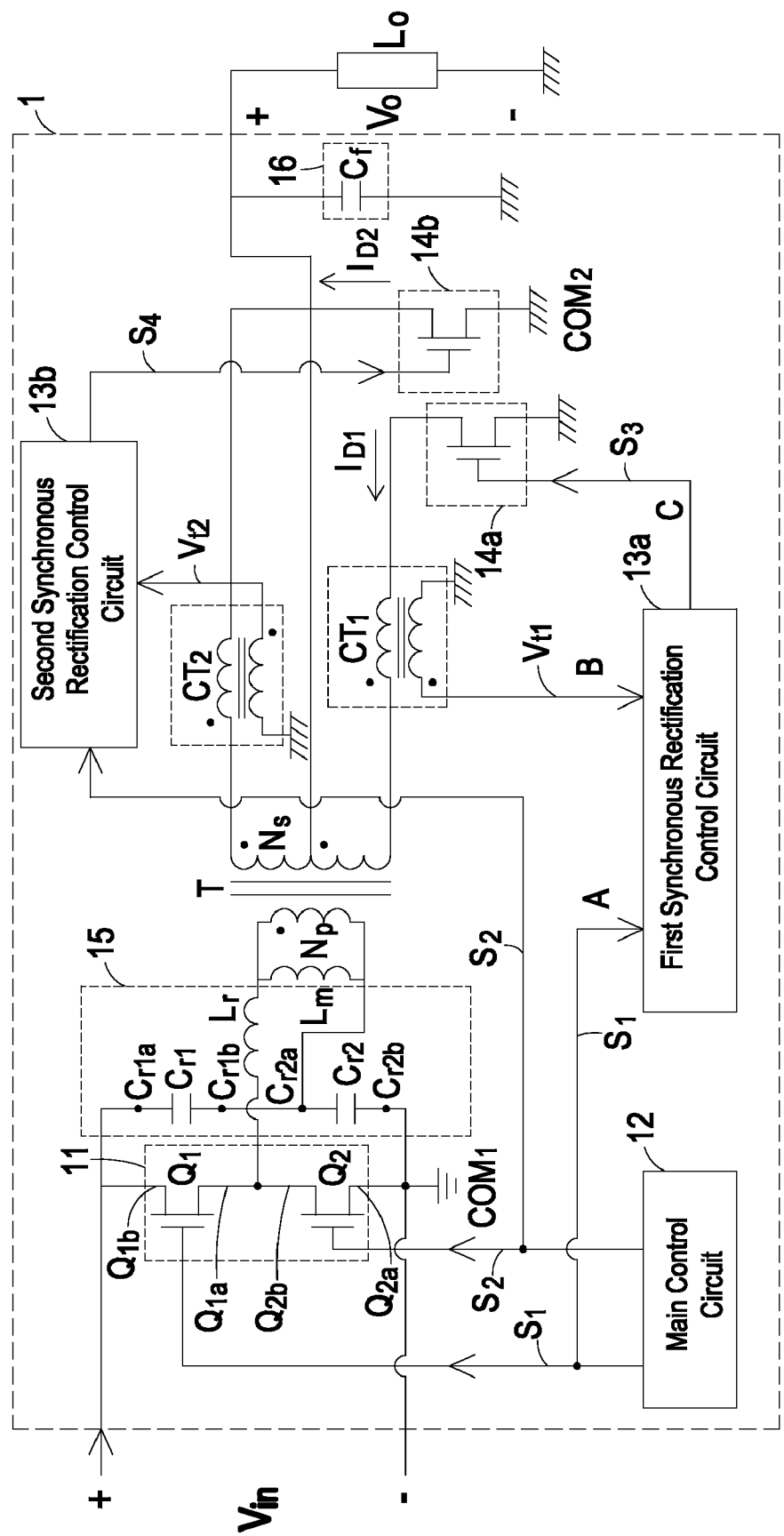
FIG. 1 is a circuit diagram showing a power converter according to a preferred embodiment of the present invention.

Referring to FIG. 1, the circuit block diagram of a power converter according to a preferred embodiment of the invention is shown. As shown in FIG. 1, the power converter 1 of the invention is connected to a load Lo and is used to convert an input voltage Vin into an output voltage Vo for use by the load Lo. The power converter 1 includes a switching circuit 11, a transformer T, a main control circuit 12, a resonant circuit 15, a filtering circuit 16, at least one synchronous rectification control circuit, for example, a first synchronous rectification control circuit 13a and a second synchronous rectification control circuit 13b shown in FIG. 1, at least one synchronous rectifier, for example, a first synchronous rectifier 14a and a second synchronous rectifier 14b shown in FIG. 1, and at least one current transformer, for example, a first current transformer CT1 and a second current transformer CT2 shown in FIG. 1.

The switching circuit 11 is used to receive an input voltage Vin and implemented by a first main switch Q1 and a second main switch Q2. However, it is to be noted that the constitution of the switching circuit 11 is not limited to the precise form disclosed herein. For example, the switching circuit 11 may be configured in the form of a full-bridge topology. A first current-conducting terminal Q1a of the first main switch Q1 is connected to a second current-conducting terminal Q2b of the second main switch Q2, and a first current-conducting terminal Q2a of the second main switch Q2 is connected to a first common node COM1. In this embodiment, the first main switch Q1 and the second main switch Q2 are alternately turning on and off.

The resonant circuit 15 is connected between the switching circuit 11 and a primary winding Np of the transformer T. In this embodiment, the resonant circuit 15 includes at least one resonant capacitor, for example, a first resonant capacitor Cr1 and a second resonant capacitor Cr2 shown in FIG. 1, and a resonant inductor Lr. A first end Cr1a of the first resonant capacitor Cr1 is connected to the second current-conducting terminal Q1b of the first main switch Q1, and a second end Cr1b of the first resonant capacitor Cr1 is connected to a first end Cr2a of the second resonant capacitor Cr2. A second end Cr2b of the second resonant capacitor Cr2 is connected to the first current-conducting terminal Q2a of the second main switch Q2 and the first common node COM1. A first end of the resonant inductor Lr is connected between the first current-conducting terminal Q1a of the first main switch Q1 and the second current-conducting terminal Q2b of the second main switch Q2. A second end of the resonant inductor Lr is connected to the primary winding Np of the transformer T.

The transformer T includes a primary winding Np and a secondary winding Ns, in which a first end of the primary winding Np is connected to a power output terminal of the switching circuit 11. That is, the primary winding Np is connected to the first current-conducting terminal Q1a of the first main switch Q1 and the second current-conducting terminal Q2b of the second main switch Q2. A second end of the primary winding Np is connected to the first terminal Cr2a of the second resonant capacitor Cr2 and the second terminal Cr1b of the first resonant capacitor Cr1. The secondary winding Ns is center-tapped and connected to the load Lo. Additionally, the primary winding Np may include an equivalent magnetizing inductance Lm for equivalently representing the inductive characteristic of the primary winding Np when the transformer T is magnetizing. In some embodiments, the magnetizing inductance Lm can be added to be connected in parallel with the primary winding Np.

The filtering circuit 16 is connected in parallel with the load Lo for filtering the electric energy to be transferred to the load Lo. In this embodiment, the filtering circuit 16 may be implemented by a filtering capacitor Cf. A first end of the filtering capacitor Cf is connected between the center tap of the secondary winding Ns of the transformer T and the load Lo, and a second end of the filtering capacitor Cf is connected to a second common node COM2.

The main control circuit 12 is connected to a control terminal of the switching circuit 11. That is, the main control circuit 12 is connected to the control terminal of the first main switch Q1 and the control terminal of the second main switch Q2. The main control circuit 12 is used to generate a first main control signal S1 and a second main control signal S2, and transmit the first main control signal S1 and the second main control signal S2 to the control terminal of the first main switch Q1 and the control terminal of the second main switch Q2, respectively, thereby regulating the switching operation of the first main switch Q1 and the second main switch Q2 through the first main control signal S1 and the second main control signal S2, respectively. Under such circumstances, the energy of the input voltage Vin may be transferred to the primary winding Np of the transformer T by the switching circuit 11. In this manner, the transformer T can induce an AC voltage across the secondary winding Ns by electromagnetic induction.

The first synchronous rectifier 14a is connected in series between a second end of the secondary winding Ns and the second common node COM2, and the second synchronous rectifier 14b is connected in series between a first end of the secondary winding Ns and the second common node COM2. The first synchronous rectifier 14a and the second synchronous rectifier 14b are used to rectify the AC voltage induced across the secondary winding Ns into a DC voltage.

The primary winding of the first current transformer CT1 is connected to the second end of the secondary winding Ns with the same polarity, and connected to the first synchronous rectifier 14a with an opposite polarity. The secondary winding of the first current transformer CT1 is connected to a first synchronous rectification control circuit 13a with the same polarity, and connected to the second common node COM2 with an opposite polarity. The primary winding of the second current transformer CT2 is connected to the first end of the secondary winding Ns with the same polarity, and connected to the second synchronous rectifier 14b with an opposite polarity. The secondary winding of the second current transformer CT2 is connected to a second synchronous rectification control circuit 13b with the same polarity, and connected to the second common node COM2 with an opposite polarity. The first current transformer CT1 may output a first detecting signal Vt1 according to a first current $I_{D1}$ flowing through the first synchronous rectifier 14a, and the second current transformer CT2 may output a second detecting signal Vt2 according to a second current $I_{D2}$ flowing through the second synchronous rectifier 14b.

The first synchronous rectification control circuit 13a is connected to the control terminal of the first synchronous rectifier 14a and the first current transformer CT1 for receiving the first detecting signal Vt1. The first synchronous rectification control circuit 13a is further connected to the control terminal of the first main switch Q1 for receiving the first main control signal S1 outputted from the main control circuit 12. The first synchronous rectification control circuit 13a is used to output a first synchronous rectification control signal S3 according to the first main control signal S1 and the first detecting signal Vt1, and transmit the first synchronous rectification control signal S3 to the control terminal of the first synchronous rectifier 14a. In this manner, the switching operation of the first synchronous rectifier 14a can be regulated. Moreover, the second synchronous rectification control circuit 13b is connected to the control terminal of the second synchronous rectifier 14b and the second current transformer CT2 for receiving the second detecting signal Vt2. The second synchronous rectification control circuit 13b is further connected to the control terminal of the second main switch Q2 for receiving the second main control signal S2 outputted from the main control circuit 12. The second synchronous rectification control circuit 13b is used to output a second synchronous rectification control signal S4 according to the second main control signal S2 and the second detecting signal Vt2, and transmit the second synchronous rectification control signal S4 to the control terminal of the second synchronous rectifier 14b. In this manner, the switching operation of the second synchronous rectifier 14b can be regulated.

In this embodiment, when the main control circuit 12 manipulates the first main switch Q1 of the switching circuit 11 to turn on by the first main control signal S1, the first synchronous rectification control circuit 13a manipulates the first synchronous rectifier 14a to turn on by the first main control signal S1. In the meantime, the first synchronous rectification control circuit 13a manipulates the first synchronous rectifier 14a to turn off by a first detecting signal Vt1 outputted from the first current transformer CT1. Likewise, when the main control circuit 12 manipulates the second main switch Q2 of the switching circuit 11 to turn on by the second main control signal S2, the second synchronous rectification control circuit 13b manipulates the second synchronous rectifier 14b to turn on through the second main control signal S2. In the meantime, the second synchronous rectification control circuit 13b manipulates the second synchronous rectifier 14b to turn off by a second detecting signal Vt2 outputted from the second current transformer CT2.

Next, the circuit constitution of the first synchronous rectification circuit 13a and the topological relationship among the internal circuit components of the first synchronous rectification circuit 13a will be described. Also, it is to be noted the same circuit elements are labeled with the same reference numeral throughout the disclosure.

Figure 2:
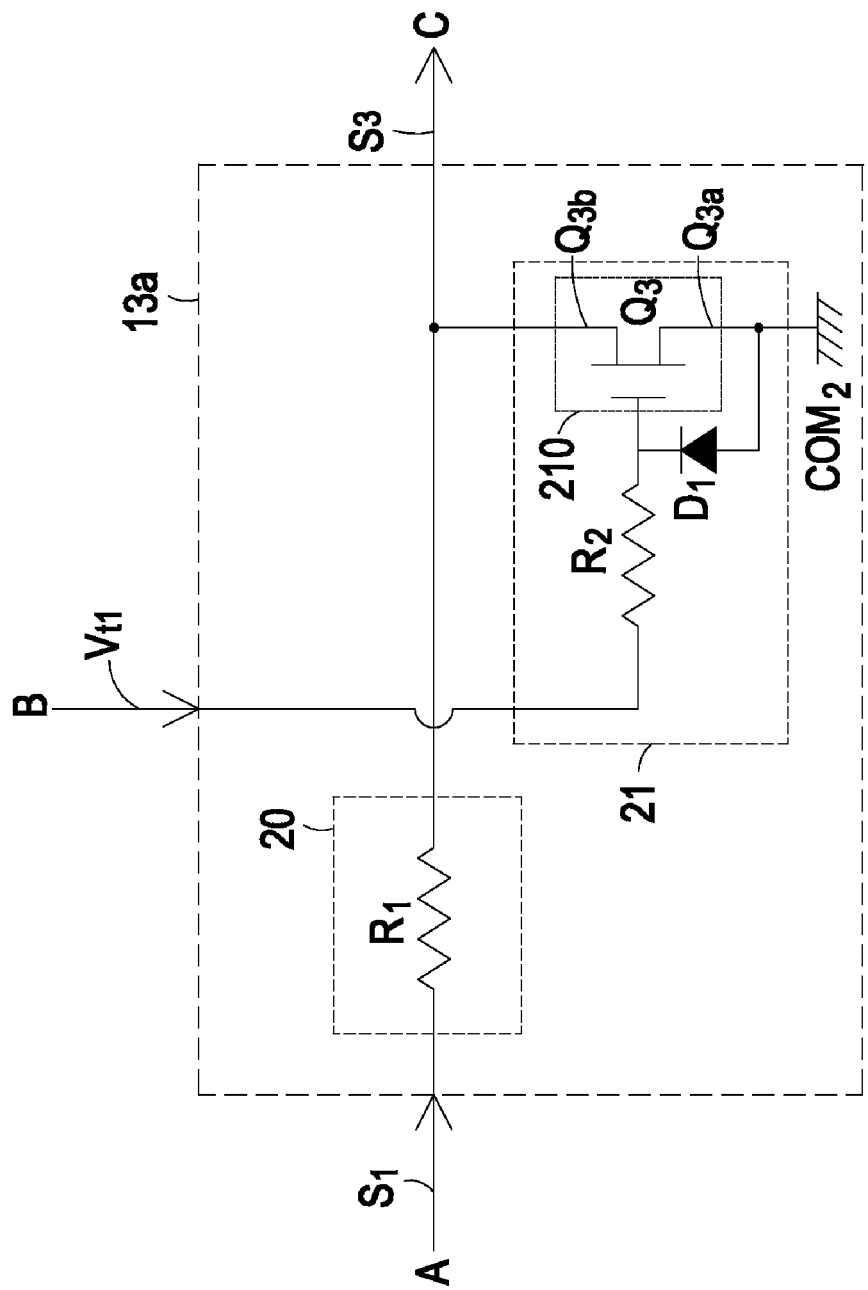
FIG. 2 is a circuit diagram showing the first synchronous rectification control circuit within the power converter of FIG. 1.

Referring to FIG. 2, the circuit constitution of the first synchronous rectification circuit 13a is illustrated. As shown in FIG. 2, the first synchronous rectification circuit 13a basically includes a startup circuit 20 and a comparator circuit 21, in which an input terminal of the startup circuit 20 is connected to the control terminal of the first main switch Q1 of the switching circuit 11 for receiving a first main control signal S1 outputted from the main control circuit 12. The output terminal of the startup circuit 20 is connected to the control terminal of the first synchronous rectifier 14a. The startup circuit 20 is used to output a first synchronous rectification control signal S3 to the control terminal of the first synchronous rectifier 14a according to the first main control signal S1. Thus, when the main control circuit 12 manipulates the first main switch Q1 to turn on through the first main control signal S1, the startup circuit 20 outputs a first synchronous rectification control signal S3 having an enable level to the control terminal of the first synchronous rectifier 14a to manipulate the first synchronous rectifier 14a to turn on. In addition, the startup circuit 20 may prevent the level of the first main control signal S1 to be pulled down with the sag of the level of the first synchronous rectification control signal S3 when the level of the first synchronous rectification control signal S3 is pulled down. The comparator circuit 21 is connected to the first current transformer CT1, the control terminal of the first synchronous rectifier 14a, and the output terminal of the startup circuit 20 for receiving the first detecting signal Vt1 outputted from the first current transformer CT1. When the detecting signal Vt1 is higher than a reference voltage of the comparator circuit 21, the level of first synchronous rectification control signal S3 outputted from the startup circuit 20 to the control terminal of the first synchronous rectifier 14a will be pulled down, such that the first synchronous rectification control signal S3 has a disable level in order to manipulate the first synchronous rectifier 14a to turn off.

In this embodiment, the startup circuit 20 basically includes a startup resistor R1 having a first end connected to the control terminal of the first main switch Q1 and a second end connected to the control terminal of the first synchronous rectifier 14a. When the first detecting signal Vt1 is higher than the reference voltage of the comparator circuit 21 and the comparator 21 manipulates the level of the first synchronous rectification control signal S3 outputted from the startup circuit 20 to be pulled down, the startup circuit 20 may prevent the level of first main control signal S1 from being pulled down with the sag of the first synchronous rectification control signal S3 through the startup resistor R1. The comparator circuit 21 includes a general comparing resistor R2, a comparator unit 210, and a second diode D1, in which a first end of the general comparing resistor R2 is connected to the first current transformer CT1 for receiving the first detecting signal Vt1, and a second end of the general comparing resistor R2 is connected to the input terminal of the comparator unit 210. Thus, the input terminal of the comparator unit 210 may receive the first detecting signal Vt1 through the general comparing resistor R2 in order allow the comparator unit 210 to determine if the first detecting signal Vt1 is higher than the turn-on voltage of the comparing unit 210 so as to turn on or off. The output terminal of the comparing unit 210 is connected to the output terminal of the startup circuit 20 and the control terminal of the first synchronous rectifier 14a. The ground terminal of the comparing unit 210 is connected to the second common node COM2. When the first detecting signal Vt1 is higher than the turn-on voltage of the comparing unit 210 and thereby turning on the comparing unit 210, the level of the first synchronous rectification control signal S3 will be pulled down by the comparator circuit 21, and thereby turning off the first synchronous rectifier 14a. It can be readily understood that the turn-on voltage of the comparing unit 210 is set to be the reference voltage for the comparator circuit 21 to compare with the first detecting signal Vt1.

In this embodiment, the comparator unit 210 may be implemented by a first auxiliary switch Q3. The turn-on voltage of the first auxiliary switch Q3 is the reference voltage for which the comparator circuit 21 uses to compare with the first detecting signal Vt1. The control terminal of the first auxiliary switch Q3 is connected to the second end of the general comparing resistor R2 through the input terminal of the comparator unit 210 for receiving the first detecting signal Vt1. The second current-conducting terminal Q3b of the first auxiliary switch Q3 is connected to the second end of the startup resistor R1 and the control terminal of the first synchronous rectifier 14a through the output terminal of the comparator unit 210. The first current-conducting terminal Q3a of the first auxiliary switch Q3 is connected to the second common node COM2 through the ground terminal of the comparator unit 210. The cathode of the first diode D1 is connected between the second end of the general comparing resistor R2 and the control terminal of the first auxiliary switch Q3, and the anode of the first diode D1 is connected to the common node COM2. When there is current flowing through the first synchronous rectifier 14a and the primary side of the first current transformer CT1, there will be an electromagnetically inducing current flowing through the secondary side of the first current transformer CT1, so that the first diode D1 and the general comparing resistor R2 will offer a passageway for the current.

In this embodiment, the second synchronous rectification control circuit 13b has a similar circuit constitution as the first synchronous rectification control circuit 13a. Furthermore, the circuit components of the second synchronous rectification control circuit 13b and the topological relationship among the second main switch Q2, the second current transformer CT2, and the second synchronous rectifier 14b are respectively similar to the circuit components of the first synchronous rectification control circuit 13b and the topological relationship among the first main switch Q1, the first current transformer CT1, and the first synchronous rectifier 14a. Therefore, it is not intended to dwell on the circuit constitution of the second synchronous rectification control circuit 13b and the topological relationship among the second main switch Q2, the second current transformer CT2, and the second synchronous rectifier 14b. Also, it is not intended to dwell on the possible embodiments for carrying out the second synchronous rectification control circuit 13b. The first synchronous rectification control circuit 13a will be taken as an illustrative example to demonstrate the possible embodiments of the invention.

In this embodiment, the first main switch Q1, the second main switch Q2, the first auxiliary switch Q3, the first synchronous rectifier 14a, and the second synchronous rectifier 14b all may be implemented by MOSFETs. Moreover, the first main switch Q1, the second main switch Q2, the first auxiliary switch Q3, the first synchronous rectifier 14a, and the second synchronous rectifier 14b may be implemented by n-CHANNEL MOSFETs or p-channel MOSFETs depending on design requirements.

Figure 3:
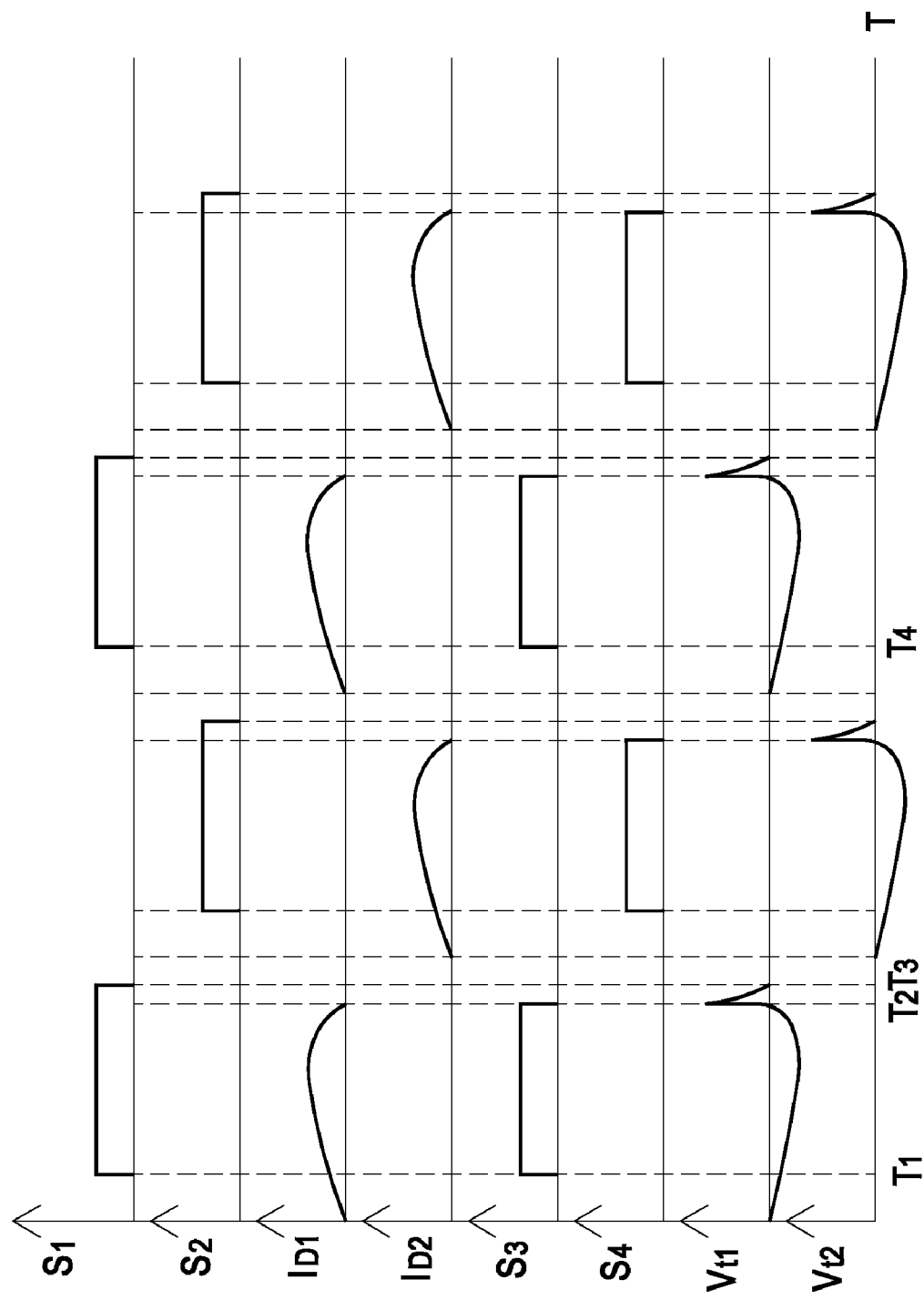
FIG. 3 is a timing chart showing the temporal relationship among the current waveforms and voltage waveforms measured in the power converter of FIG. 1.

Next, the operating theorem of the power converter according to the invention will be described. Referring to FIGS. 1, 2 and 3, wherein FIG. 3 is a timing chart depicting the temporal relationship among the voltage waveforms and current waveforms measured in the power converter of FIG. 1. As shown in FIG. 3, at the point of T1, the main control circuit 12 will output a first main control signal S1 having an enable level to the control terminal of the first main switch Q1, such that the first main switch Q1 is turned on and the first synchronous rectification control circuit 13a outputs a first synchronous rectification control signal S3 having an enable level to the control terminal of the first synchronous rectifier 14a, thereby turning on the first synchronous rectifier 14a. In this manner, the first current $I_{D1}$ flowing through the first synchronous rectifier 14a will rise, and the first detecting signal Vt1 outputted from the first current transformer CT1 will be a negative value with reference to the first current $I_{D1}$. In addition, because the first synchronous rectifier 14a is implemented by a MOSFET, the first current $I_{D1}$ which is rising from zero prior to the point T1 will flow through the body diode of the first synchronous rectifier 14a.

When the time reaches the point T2, the first current $I_{D1}$ flowing through the first synchronous rectifier 14a has dropped to zero and is about to reverse its flowing direction. The first detecting signal Vt1 outputted from the first current transformer CT1 will transition from a negative value to a positive value in response to the reversal of the flowing direction of the first current $I_{D1}$, thereby forming a pulse. In the meantime, the first detecting signal Vt1 will be transmitted to the control terminal of the first auxiliary switch Q3 through the general comparing resistor R2 of the comparator circuit 21. When the first detecting signal Vt1 is higher than the turn-on voltage of the first auxiliary switch Q3, the first auxiliary switch Q3 will be manipulated to turn on. In this manner, the comparator circuit 21 will pull down the level of the first synchronous rectification control signal S3, such that the level of the first synchronous rectification control signal S3 will transition from the enable level to the disable level, and thereby turning off the first synchronous rectifier 14a. It can be understood that when the first current $I_{D1}$ is about to reverse its flowing direction, the first current transformer CT1 can readily detect the reversal of the flowing direction of the first current $I_{D1}$ and send the detecting result to the first synchronous rectification control circuit 13a, thereby allowing the first synchronous rectification control circuit 13a to manipulate the first synchronous rectifier 14a to turn off instantly.

Figure 4:
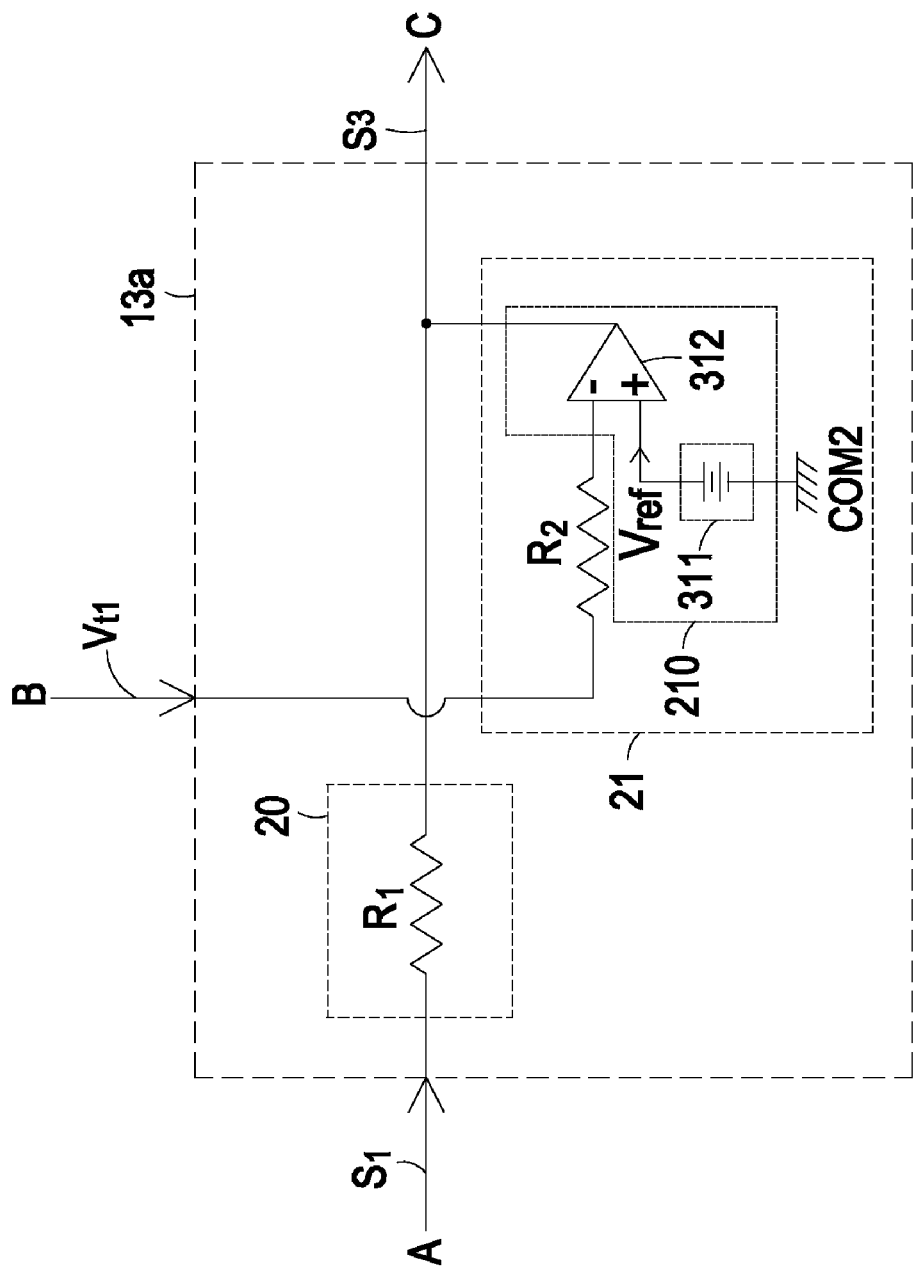
FIG. 4 shows a modification of the comparator circuit within the first synchronous rectification control circuit of FIG. 2.

Referring to FIGS. 3 and 4, in which FIG. 4 shows a modification of the comparator circuit of FIG. 2. As shown in FIG. 4, the comparator circuit 21 of FIG. 4 only includes a general comparing resistor R2 and a comparator unit 210 compared to the comparator circuit 21 of FIG. 2. In this embodiment, the comparator unit 210 is implemented by a comparator 312 and a voltage source 311 instead. The first end of the general comparator resistor R2 is connected to the first current transformer CT1 for receiving the first detecting signal Vt1, and the second end of the general comparing resistor R2 is connected to the inverting input terminal of the comparator 312 through the input terminal of the comparator unit 210. The voltage source 311 is connected in series between the non-inverting terminal of the comparator 312 and the ground terminal of the comparator unit 210, and is connected to the second common node COM2 through the ground terminal of the comparator unit 210. The voltage source 311 is used to provide a reference voltage Vref to the non-inverting terminal of the comparator 312. The output terminal of the comparator 312 is connected to the second end of the startup resistor R1 of the startup circuit 20 and the control terminal of the first synchronous rectifier 14a through the output terminal of the comparator unit 210. The comparator 312 is used to compare the first detecting signal Vt1 with the reference voltage Vref, and outputs a low-level signal to pull down the level of the first synchronous rectification control signal S3 outputted from the startup circuit 20 when the first detecting signal Vt1 is higher than the reference voltage Vref. Under this condition, the first synchronous rectification control signal S3 will have a disable level and thereby turning off the first synchronous rectifier 14a.

Therefore, at the point T1 shown in FIG. 3, the first synchronous rectifier 14a receives the first synchronous rectification control signal S3 having an enable level and turn on accordingly. Later on, the first current $I_{D1}$ flowing through the first synchronous rectifier 14a will start to drop. Under this condition, the first detecting signal Vt1 outputted from the first current transformer CT1 will start to rise. When the first detecting signal is substantially higher than the reference voltage Vref at the point of T2, the comparator 312 will output a low-level signal to pull down the level of the first synchronous rectification control signal S3 outputted from the startup circuit 20, such that the level of the first synchronous rectification control signal S3 is transitioned to the disable level. In this manner, the first synchronous rectifier 14a will turn off. Consequently, the first synchronous rectification control circuit 13a can instantly manipulate the first synchronous rectifier 14a to turn off according to the detecting result of the first current transformer CT1 by the comparator circuit 21 according to this embodiment.

The operation of the second main switch Q2, the second current transformer CT2, the second synchronous rectification control circuit 13b, and the second synchronous rectifier 14b is analogous to the operation of the first main switch Q1, the first current transformer CT1, the first synchronous rectification control circuit 13a, and the first synchronous rectifier 14a, respectively, and it is not intended to give details herein.

Because current transformers are able to detect current variations in a prompt fashion, the power converter 1 of the invention can detect if a first current $I_{D1}$ is reversely flowing through the first synchronous rectifier 14a and if a second current $I_{D2}$ is reversely flowing through the second synchronous rectifier 14b by the first current transformer CT1 and the second current transformer CT2. In this manner, the first synchronous rectification control circuit 13a and the second synchronous rectification control circuit 13b can instantly and accurately manipulate the first synchronous rectifier 14a and the second synchronous rectifier 14b to turn off. Thus, the first synchronous rectifier 14a and the second synchronous rectifier 14b are not prone to be burnt down and thereby enhancing the overall efficiency of the power converter 1.

Next, other possible embodiments for practicing the first synchronous rectification control circuit 13a and the second synchronous rectification control circuit 13b will be described. Because the first synchronous rectification control circuit 13a has a similar circuit constitution and topological relationship as the second synchronous rectification control circuit 13b, the synchronous rectification control circuit 13a will be taken as a demonstrative example for illustration. In addition, the same circuit components will bear the same reference numerals throughout the disclosure.

Figure 5:
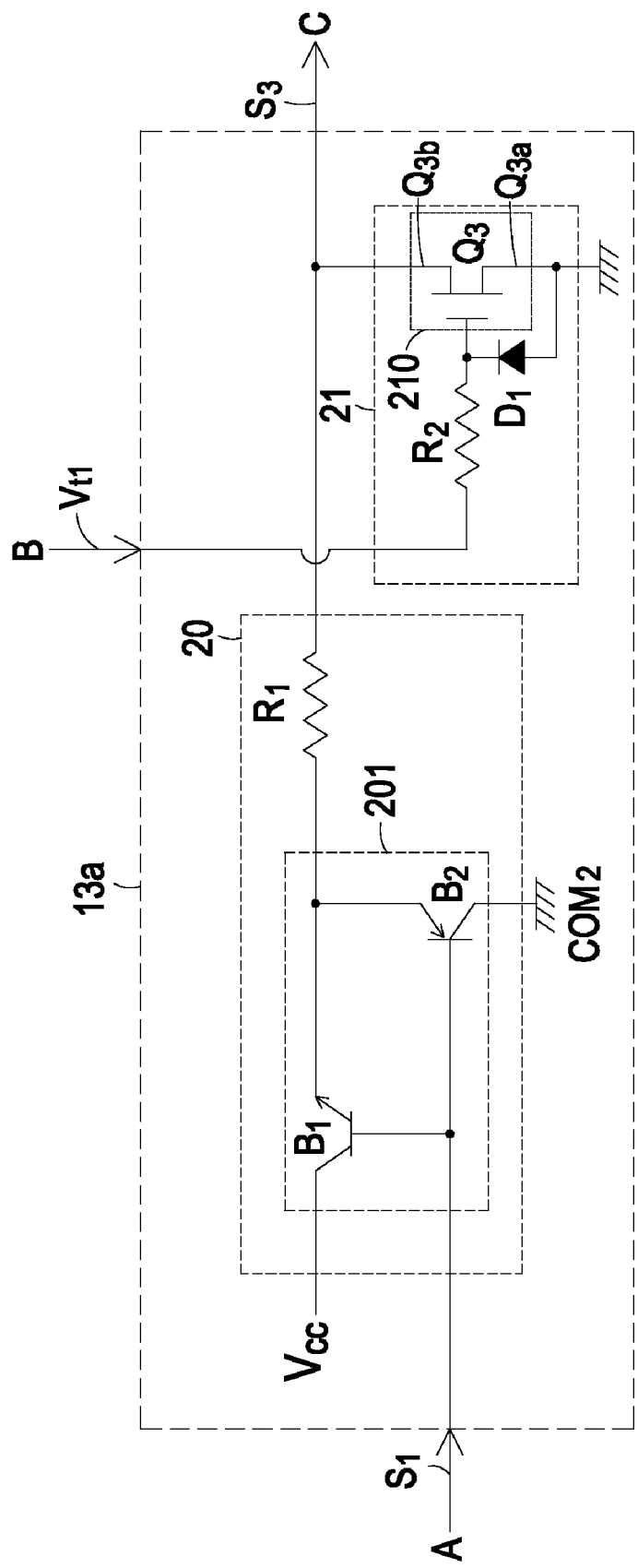
FIG. 5 shows a modification of the startup circuit within the first synchronous rectification control circuit of FIG. 2.

In this embodiment, in order to enhance the driving capability of the power converter 1, the startup circuit 20 of the first synchronous rectification control circuit 13a further includes a totem pole circuit 201, as shown in FIG. 5. The totem pole circuit 201 is connected to the control terminal of the switching circuit 11. More precisely, the totem pole circuit 201 is connected between the control terminal of the first main switch Q1 and the startup resistor R1 of the startup circuit 20. The totem pole circuit 201 includes a NPN-type BJT B1 and a PNP-type BJT B2, wherein the base of the NPN-type BJT B1 is connected to the base of the PNP-type BJT B2 and the control terminal of the first main switch Q1. The collector of the NPN-type BJT B1 is used to receive an auxiliary voltage Vcc. The emitter of the NPN-type BJT B1 is connected to the startup resistor R1 of the startup circuit 20. The emitter of the PNP-type BJT B2 is connected between the emitter of the NPN-type BJT B1 and the startup resistor R1. The collector of the PNP-type BJT B2 is connected to the second common node COM2. In this embodiment, the NPN-type BJT B1 and the PNP-type BJT B2 are respectively manipulated by the first main control signal S1 to turn on and off, thereby improving the driving capability of the power converter 1 by the totem pole circuit 201. Certainly, the totem pole circuit 201 is not limited to be applied to the startup circuit 20 of the first synchronous rectification control circuit 13a as shown in FIG. 5. Alternatively, the totem pole circuit 201 is also applicable to the startup circuit discussed in the aforesaid embodiments and the following embodiments.

Figure 6:
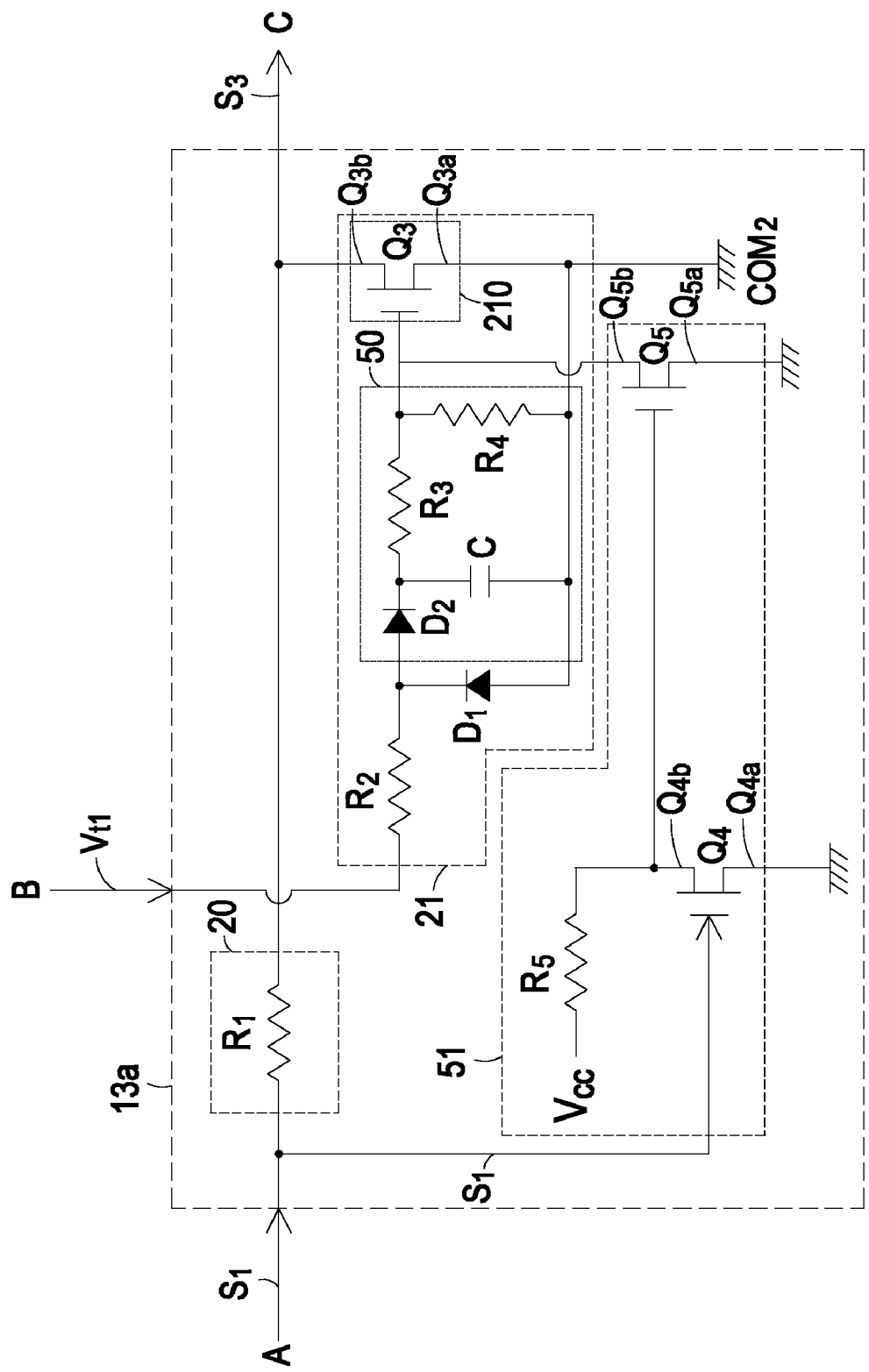
FIG. 6 shows an alternative embodiment of the first synchronous rectification control circuit within the power converter according to the invention.

In this embodiment, when the first synchronous rectifier 14a turns off, the first detecting signal Vt1 outputted from the current transformer CT1 will continuously fluctuate because the leakage inductance on the circuitry of the power converter 1 is likely to oscillate with the parasitic capacitance of the first synchronous rectifier 14a. This would cause the first synchronous rectifier 14a to be repeatedly turning on and off instead of staying at the OFF state. To prohibit the aforesaid phenomenon, a holding circuit 50 may be placed in the first synchronous rectification control circuit 13a of the comparator circuit 21 of FIG. 2 so as to form a circuit configuration as shown in FIG. 6. The holding circuit 50 is connected between the general comparing resistor R2 and the control terminal of the comparator unit 210. The holding circuit 50 is used to receive the first detecting signal Vt1 through the general comparing resistor R2 and hold the pulse formed when the first detecting signal Vt1 is transitioning from a negative value to a positive value for a predetermined period. As shown in FIG. 3, when the first current $I_{D1}$ flowing through the first synchronous rectifier 14a is dropped from a positive value to zero and is about to reverse its flowing direction and a pulse is formed when the first detecting signal Vt1 is transitioning from a negative value to a positive value, the holding circuit 50 will hold the state and level of the first detecting signal Vt1 for a predetermined period. In this manner, the first synchronous rectifier 14a may stay at the OFF state during the predetermined period with reference to the first detecting signal Vt1. Accordingly, the first synchronous rectifier 14a will not be subjected to the oscillation resulting from the leakage inductance on the circuitry of the power converter 1 and the parasitic capacitance of the first synchronous rectifier 14a, and the adverse effect that the first synchronous rectifier 14a can not stay at the OFF state can be avoided.

In this embodiment, the holding circuit 50 includes a second diode D2, a holding capacitor C, a first holding resistor R3, and a second holding resistor R4, in which the anode of the second diode D2 is connected to the second end of the general comparing resistor R2 and the cathode of the first diode D1. The cathode of the second diode D2 is connected to a first end of the first holding resistor R3 and a first end of the holding capacitor C. A second end of the first holding resistor R3 is connected to the control terminal of first auxiliary switch Q3 and a first end of the second holding resistor R4. A second end of the second holding resistor R4 and a second end of the holding capacitor C are connected to the second common node COM2. In this embodiment, the resistance of the second holding resistor R4 may be greater than the resistance of the first holding capacitor R3.

Next, the operation of the holding circuit 50 of FIG. 6 will be described. Referring to FIGS. 3 and 6, at the point of T2, the first current $I_{D1}$ flowing through the first synchronous rectifier 14a is dropped from a positive value to zero and is about to be reversely flowing, the detecting signal Vt1 outputted from the first current transformer CT1 will transition from a negative value to a positive value and thus a pulse is formed. The holding capacitor C will be charged through the general comparing resistor R2 and the second diode D2 accordingly. When the leakage inductance on the circuitry of the power converter 1 is oscillating with the parasitic capacitance of the first synchronous rectifier 14a and the first detecting signal Vt1 outputted from the first current transformer CT1 is fluctuated accordingly, the first detecting signal Vt1 will stop charging the holding capacitor C. In the meantime, the holding capacitor C can not discharge because the impedance relationship between the first holding resistor R3 and the second holding resistor R4, such that the voltage across the holding capacitor C will be held at a high level. Therefore, the first auxiliary switch Q3 will stay at the ON state. Under this condition, the first synchronous rectifier 14a will not be subjected to the oscillation resulting from the leakage inductance on the circuitry of the power converter 1 and the parasitic capacitance of the first synchronous rectifier 14a, thereby staying at the OFF state.

In addition, the holding circuit 50 can hold the first synchronous rectifier 14a at the OFF state. To allow the first synchronous rectifier 14a to be able to transition from the OFF state to the ON state in the next switching cycle of the first main switch Q1 instead of incessantly staying at the OFF state, the first synchronous rectification control circuit 13a further includes a reset circuit 51, as shown in FIG. 6. The reset circuit 51 is connected to the output terminal of the holding circuit 50 and the control terminal of the first main switch Q1 in the switching circuit 11 for resetting the holding circuit 50. In this manner, the first synchronous rectifier 14a is able to smoothly transition from the OFF state to the ON state in the next switching cycle of the first main switch Q1.

The reset circuit includes a first reset switch Q4, a second reset switch Q5, and a first reset resistor R5, in which the control terminal of the first reset switch Q4 is connected to the control terminal of the first main switch Q1 for receiving the first main control signal S1 outputted from the main control circuit 12. The first current-conducting terminal Q4a of the first reset switch Q4 is connected to the second common node COM2, and the second current-conducting terminal Q4b of the first reset switch Q4 is connected to a first end of the first reset resistor R5 and the control terminal of the second reset switch Q5. The first current-conducting terminal Q5a of the second reset switch Q5 is connected to the second common node COM2, and the second current-conducting terminal Q5b of the second reset switch Q5 is connected to the control terminal of the first auxiliary switch Q3, the second end of the first holding resistor R3, and the first end of the second holding resistor R4. A second end of the first reset resistor R5 is used to receive an auxiliary power Vcc. In addition, the first reset switch Q4 and the second reset switch Q5 may be implemented by MOSFETs. More specically, and the first reset switch Q4 and the second reset switch Q5 may be implemented by n-channel MOSFETs or p-channel MOSFETs depending on design requirements.

Next, the operation of the reset circuit 51 of FIG. 6 will be described. Referring to FIGS. 3 and 6, the first main control signal S1 is held at an enable level during the period of T1 and T2. Later on, the first detecting signal Vt1 will transition from a negative value to a positive value and thereby forming a pulse. The pulse will last for a predetermined period as a result of the holding circuit 50 since the inception of the point T2. When it reaches the point of T3, the level of the first main control signal S1 will transition from the enable level to the disable level. In the meantime, the first reset switch Q4 will turn off with according to the first main control signal S1. Therefore, the auxiliary power Vcc will manipulate the second reset switch Q5 to turn on through the first reset resistor R5. Thus, the holding capacitor C will be fully discharged by the turn-on of the second reset switch Q5. In this manner, the first auxiliary switch Q3 will turn off and the holding circuit 50 will be reset by the reset circuit 51. Hence, when the first main control signal S1 transitions from the disable level to the enable level at the point of T4, the startup circuit 20 will output a first synchronous rectification control signal S3 having an enable level to the control terminal of the first synchronous rectifier 14a according to the first main control signal S1. In this manner, the first synchronous rectifier 14a is able to smoothly transition from the OFF state to the ON state in the next switching cycle of the first main switch Q1.

Figure 7:
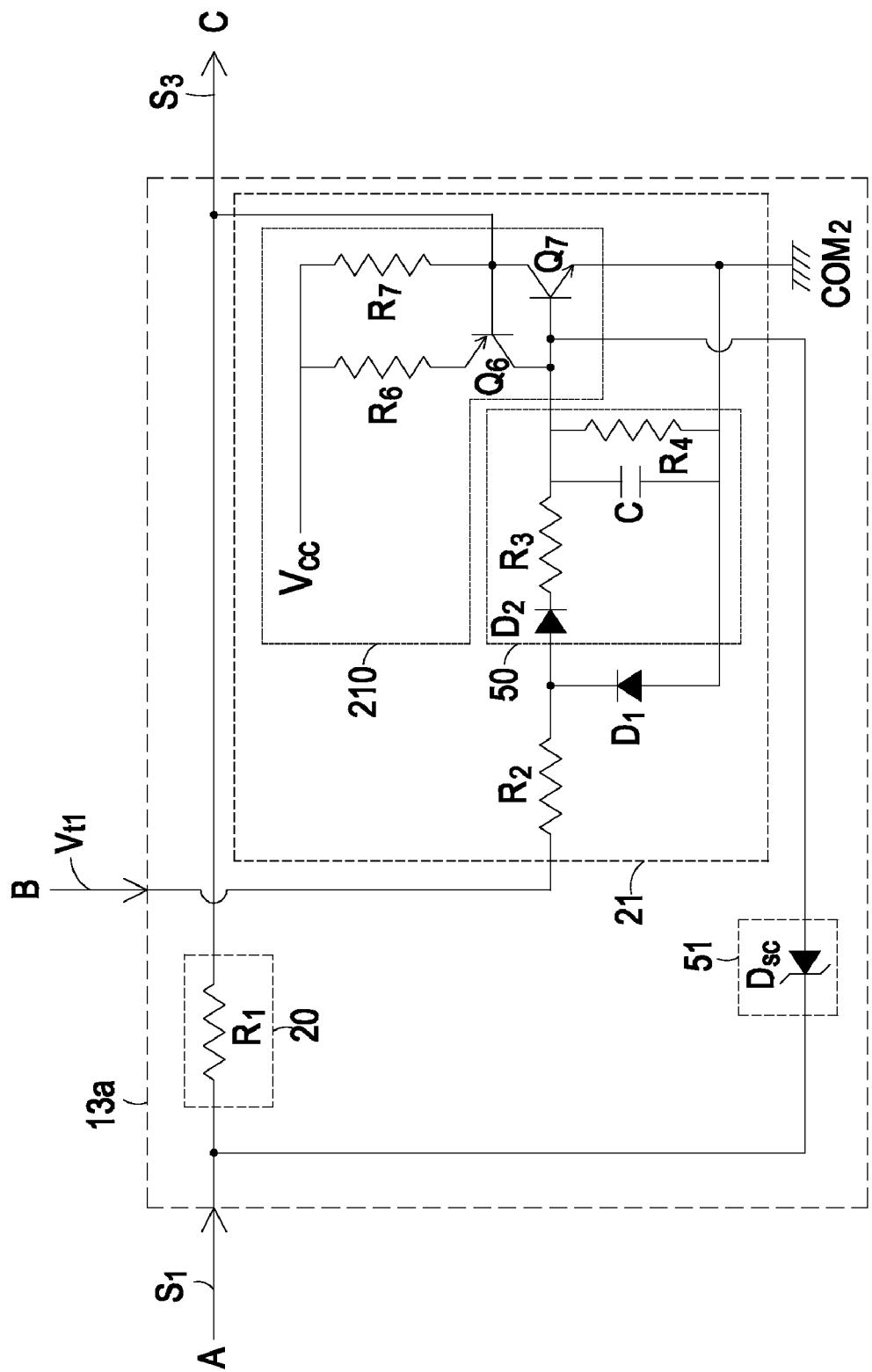
FIG. 7 shows a modification of the first synchronous rectification control circuit of FIG. 6.

Referring to FIG. 7, the circuit constitution of the first synchronous rectification control circuit according to another embodiment of the invention is shown. As shown, the circuit constitution of the first synchronous rectification control circuit in FIG. 7 is partially analogous to the circuit constitution of the first synchronous rectification control circuit in FIG. 6. Also, the same circuit element is labeled with the same reference numerals throughout the disclosure. Thus, the descriptions concerning the characteristics and operations of the circuit components of FIG. 7 will be omitted. Compared to FIG. 6, the comparator unit 210 of the comparator circuit 21 in FIG. 7 is implemented by a second auxiliary switch Q6, a third auxiliary switch Q7, a first local comparing resistor R6, and a second local comparing resistor R7. The comparator unit 210 and the holding circuit 50 will form an interlocking circuit. The second auxiliary switch Q6 may be implemented by a PNP-type BJT, and the base of the second auxiliary switch Q6 is connected to a first end of the second local comparator resistor R7 and the collector of the third auxiliary switch Q7. The base of the second auxiliary switch Q6 is further connected to the control terminal of the first synchronous rectifier 14a and the output terminal of the startup circuit 20 through the output terminal of the comparator unit 210. The emitter of the second auxiliary switch Q6 is connected to a first end of the first local comparing resistor R6, and the collector of the second auxiliary switch Q6 is connected to the output terminal of the holding circuit 50, i.e. the second end of the first holding resistor R3 and the first end of the second holding resistor R4 through the input terminal of the comparator unit 210. The third auxiliary switch Q7 may be implemented by a NPN-type BJT, and the base of the third auxiliary switch Q7 is connected to the output terminal of the holding circuit 50, i.e. the second end of the first holding resistor R3 and the first end of the second holding resistor R4 through the input terminal of the comparator unit 210. The collector of the third auxiliary switch Q7 is connected to the first end of the second local comparing resistor R7 and the base of the second auxiliary switch Q6, and is further connected to the control terminal of the first synchronous rectifier 14a through the output terminal of the comparator unit 210. The emitter of the third auxiliary switch Q7 is connected to the second common node COM2 through the ground terminal of the comparator unit 210. A second end of the first local comparing resistor R6 and a second end of the second local comparing resistor R7 are connected with each other for receiving the auxiliary power Vcc.

Compared to FIG. 6, the holding capacitor C of the holding circuit 50 is connected in parallel with the second holding resistor R4 instead, and the first end of the holding capacitor C is connected to the second end of the first holding resistor R3, the first end of the second holding resistor R4, and the input terminal of the comparator unit 210. The second end of the holding capacitor C is connected to the second end of the second holding resistor R4 and the common node COM2. It is to be noted that the holding circuit 50 of FIG. 7 can attain the same performance as the holding circuit 50 of FIG. 6.

Next, the operation of the synchronous rectification control circuit 13a of FIG. 7 will be described. Referring to FIGS. 3 and 7, the first synchronous rectifier 14a receives a first synchronous rectification control signal S3 having an enable level and is at the ON state at the point of T1. Later on, the first current $I_{D1}$ flowing through the first synchronous rectifier 14a starts to drop and the first detecting signal Vt1 outputted from the first current transformer CT1 starts to rise. When the first detecting signal Vt1 is substantially higher than the turn-on voltage of the third auxiliary switch Q7 at the point of T2, the third auxiliary switch Q7 is turned on. In the meantime, the voltage at the base of the second auxiliary switch Q6 is pulled down so as to turn on the second auxiliary switch Q6. Therefore, the base of the third auxiliary switch Q7 may receive the auxiliary power Vcc through the first local comparing resistor R6, thereby allowing the third auxiliary switch Q7 to stay at the ON state. Under this condition, the first synchronous rectification control signal S3 will be pulled down. Moreover, the first synchronous rectification control signal S3 will be pulled down further due to the effect resulting from the holding circuit 50. This would allow the first synchronous rectifier 14a to be immune from the oscillation resulting from the leakage inductance on the circuitry of the power converter 1 and the parasitic capacitance of the first synchronous rectifier 14a and allow the first synchronous rectifier 14a to stay at the OFF state. It can be understood that the comparator circuit 21 is able to pull down the first synchronous rectification control signal S3 when the first detecting signal Vt1 is higher than the turn-on voltage of the third auxiliary switch Q7. Consequently, the turn-on voltage of the third auxiliary switch Q7 is the reference voltage for the comparator circuit 21 to compare with the first detecting signal Vt1.

Figure 8:
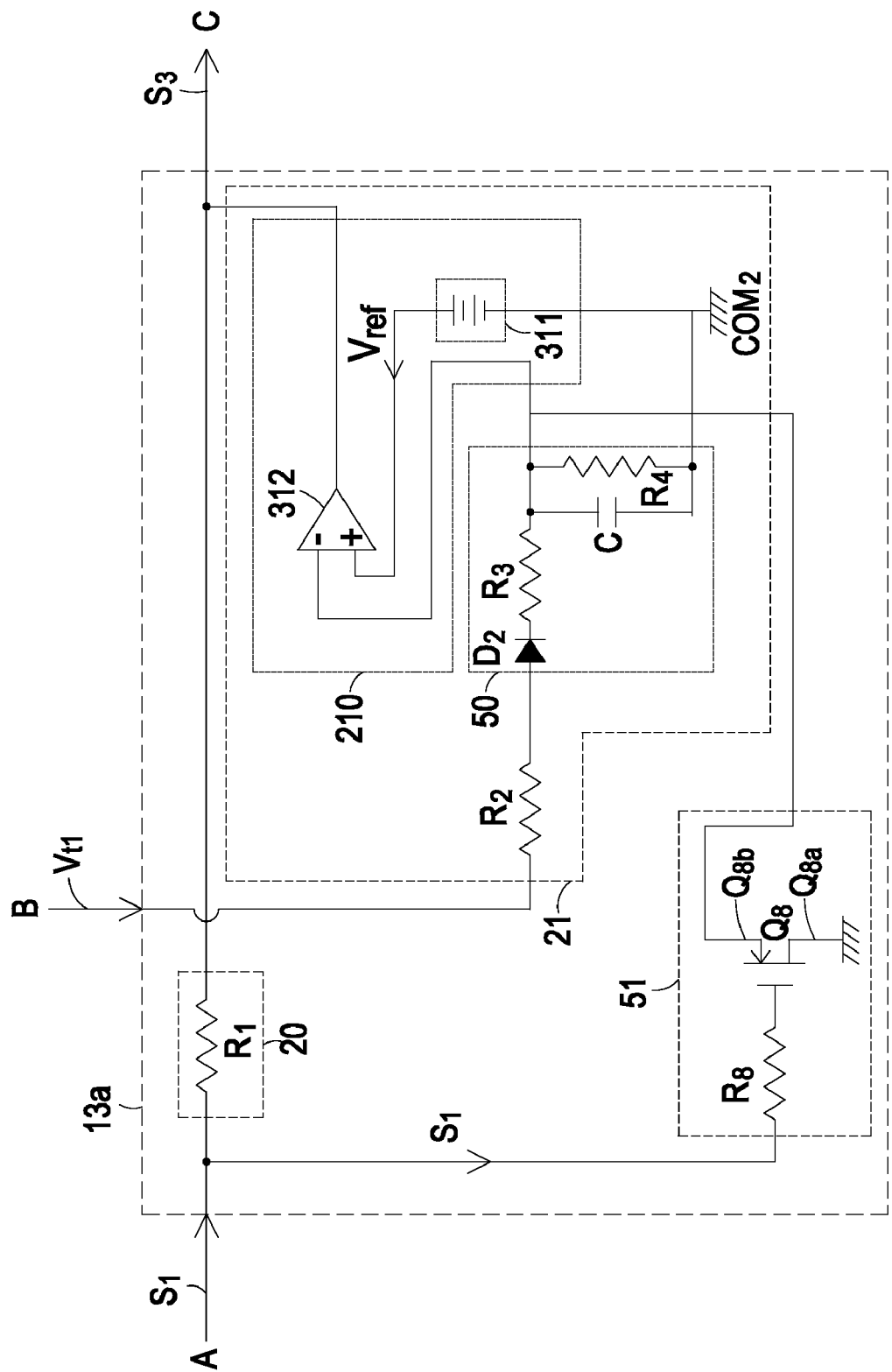
FIG. 8 shows another modification of the first synchronous rectification control circuit of FIG. 6.

Alternatively, the holding circuit 50 of FIG. 7 can be applied to the comparator circuit 21 of FIG. 4, and the resultant circuitry is shown in FIG. 8. Under such circumstances, the holding circuit 50 is connected between the general comparing resistor R2 and the input terminal of the comparing unit 210.

Certainly, the first local comparing resistor R6 and the second local comparing resistor R7 are not limited to be used to receiving the auxiliary power Vcc as shown in FIG. 7. In other possible embodiments, the first local comparing resistor R6 and the other end of the second local comparing resistor R7 may be connected to the control terminal of the switching circuit 11, i.e. the control terminal of the first main switch Q1 in order to receive the first main control signal S1. Such configuration may enable the holding circuit 50 to attain the same performance as other configurations. In addition, the holding circuit 50 may be implemented by a RS trigger.

Certainly, the circuit constitution of the reset circuit is not limited to the precise form disclosed in FIG. 6, and may have alternative modifications as depicted in FIGS. 7 and 8. Referring to FIG. 7, the reset circuit 51 is implemented by a Schottky diode Dsc. In alternative embodiments, the Schottky diode Dsc can be an ordinary diode. The cathode of the Schottky diode Dsc is connected to the control terminal of the first main switch Q1 for receiving the first main control signal S1, and the anode of the Schottky diode Dsc is connected to the first holding resistor R3 and the second holding resistor R4. When the first main control signal S1 is at a disable level, the reset circuit 51 is able to reset the holding circuit 50 through the Schottky diode Dsc, thereby fully discharging the holding capacitor C.

Referring to FIG. 8, an alternative modification of the reset circuit of FIG. 6 is shown. As shown, the reset circuit 51 includes a second reset resistor R8 and a third reset switch Q8, in which a first end of the second reset resistor R8 is connected to the control terminal of the switching circuit 11, i.e. the control terminal of the first main switch Q1 for receiving the first main control signal S1. A second end of the second reset terminal R8 is connected to the control terminal of the third reset switch Q8. The third reset switch Q8 may be implemented by a p-channel MOSFET or a PNP-type BJT. The first current-conducting terminal Q8a of the third reset switch Q8 is connected to the second common node COM2, and the second current-conducting terminal Q8b of the third reset switch Q8 is connected to the second end of the first holding resistor R3 and the first end of the second holding resistor R4. By virtue of the aforesaid circuit topology, the reset circuit 51 may reset the holding circuit 50 to fully discharge the holding capacitor C when the first main control signal S1 is at a disable level.

Certainly, the first end of the second reset resistor R8 may be connected to the other control terminal, i.e. the control terminal of the second main switch Q2 instead for receiving the second main control signal S2. Under this condition, the third reset switch Q8 must be implemented by a n-channel MOSFET. Such configuration may achieve the same performance with other configurations.

Certainly, the comparator circuit 21 of FIG. 2, the comparator circuit 21 of FIG. 4, and the comparator circuit 21 of FIG. 7 are interchangeable with each other. The startup circuit 20 of FIG. 2 is interchangeable with the startup circuit 20 of FIG. 5. The holding circuit 50 of FIG. 6 and the holding circuit 50 of FIGS. 7 and 8 are interchangeable. The reset circuit 51 of FIG. 6, the reset circuit 51 of FIG. 7, and the reset circuit 51 of FIG. 8 are interchangeable with each other.

Figure 9:
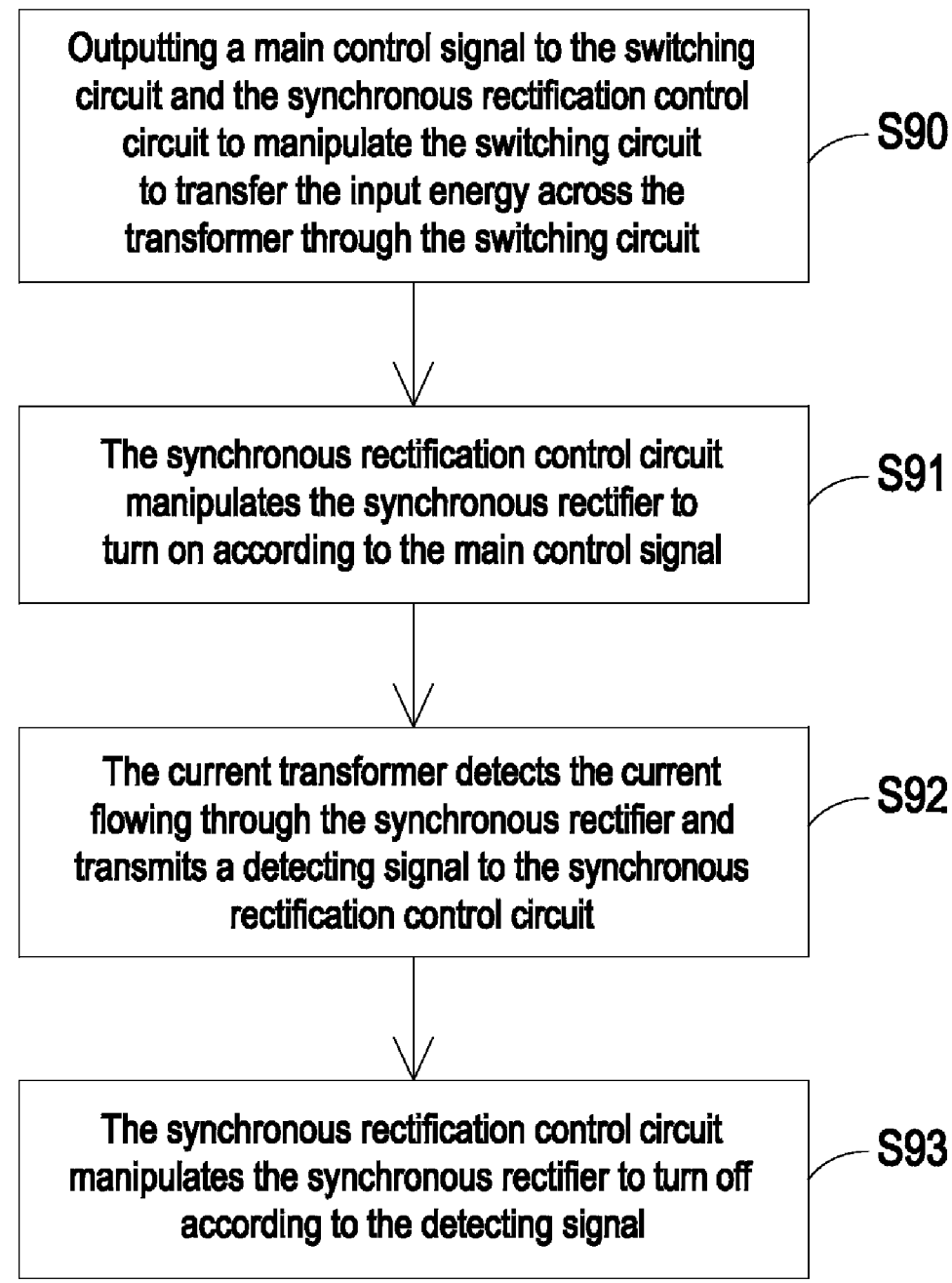
FIG. 9 is a flowchart illustrating the control method for the first synchronous rectification control circuit of FIG. 1.

Next, the process of the control method applied to the first synchronous rectifier is illustrated. Referring to FIGS. 2 and 9, the flowchart illustrating the control method applied to the first synchronous rectifier 14a of FIG. 1 is depicted in FIG. 9. In the beginning, a first main control signal S1 is generated by the main control circuit 12 and outputted to the switching circuit 11 and the first synchronous rectification control circuit 13a, as shown in step S90. Therefore, the switching circuit 11 drives the transformer T to conduct energy transfer. Next, the first synchronous rectification control circuit 13a manipulates the first synchronous rectifier 14a to turn on according to the first main control signal S1, as shown in step S91. Next, the first detecting signal Vt1 is transmitted from the current transformer CT to the first synchronous rectification control circuit 13a, as shown in step S92. Finally, the first synchronous rectification control circuit 13a manipulates the first synchronous rectifier 14a to turn off according to the first detecting signal Vt1, as shown in step S93.

Figure 10:
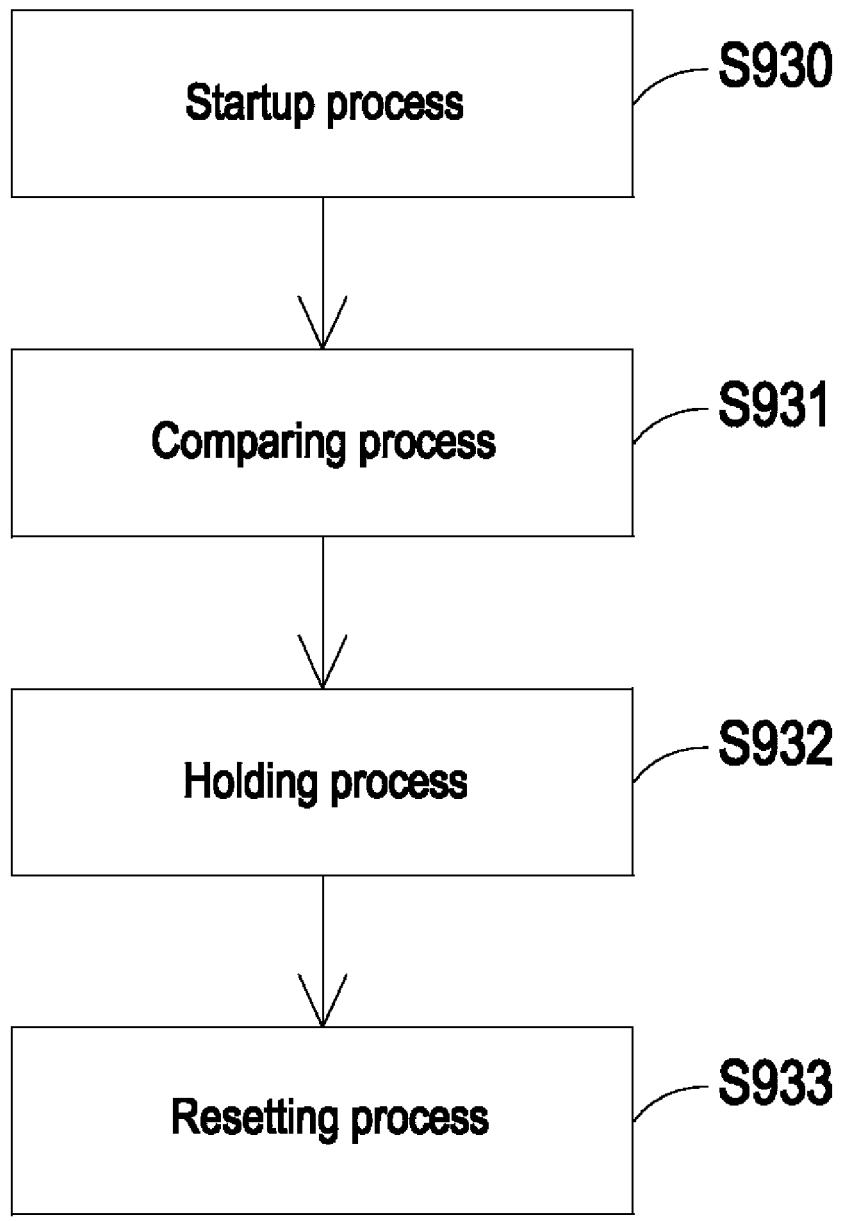
FIG. 10 is a flowchart illustrating the sub-steps of the step S93 in the control method of FIG. 9.

In addition, the step S93 may further include four sub-steps, as shown in FIG. 10. In FIG. 10, these sub-steps are carried out in a sequential order and includes a startup process S930, a comparing process S931, a holding process S932, and a resetting process S933. In the beginning, the startup process S930 is performed by allowing the startup circuit 20 to receive the first main control signal S1 and outputting a first synchronous rectification control signal S3 to the control terminal of the first synchronous rectifier 14a according to the first main control signal S1, and prohibiting the level of the first main control signal S1 to be pulled down with the sag of the first synchronous rectification control signal S3. Next, the comparing process S931 is performed by comparing the first detecting signal Vt1 with a reference voltage by the comparator unit 210 so as to manipulate the first synchronous rectifier 14a to turn off when the level of the first detecting signal Vt1 is higher than the level of the reference voltage. Next, the holding process S932 is carried out by allowing the holding circuit 50 to hold the pulse formed when the first detecting signal Vt1 is transitioning from a negative value to a positive value for a predetermined period. Next, the resetting process S933 is performed by allowing the reset circuit 51 to reset the holding circuit 50 such that the first synchronous rectifier 14a is able to be smoothly transitioned from the OFF state to the ON state in the next switching cycle of the switching circuit 11.

The control method for the second synchronous rectifier 14b of FIG. 1 is analogous to the control method for the first synchronous rectifier 14a, so it is not intended to give details herein. Because the power converter 1 is capable of instantly and accurately manipulating the first synchronous rectifier 14a and the second synchronous rectifier 14b to turn off by the first current transformer CT1 and the second transformer CT2, the first synchronous rectifier 14a and the second synchronous rectifier 14b will not be vulnerable to scorch. Hence, the overall efficiency of the power converter 1 of the invention is greatly reinforced.

While the present invention has been described in terms of what are presently considered to be the most practical and preferred embodiments, it is to be understood that the present invention need not be restricted to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A power converter comprising:
    a switching circuit for receiving an input voltage;
    a transformer having a primary winding and a secondary winding, wherein the primary winding is connected to a power output terminal of the switching circuit;
    a main control circuit connected to a control terminal of the switching circuit for outputting a main control signal and thereby manipulating the switching circuit and allowing the energy of the input voltage to be transferred to the primary winding through the switching circuit;
    at least one synchronous rectifier connected in series with the secondary winding and a second common node;
    at least one current transformer connected in series with the a synchronous rectifier for outputting a detecting signal according to a current flowing through the synchronous rectifier; and
    at least one synchronous rectification control circuit connected to a control terminal of the synchronous rectifier, the current transformer, and a control terminal of the switching circuit for receiving the detecting signal and the main control signal and outputting a synchronous rectification control signal to manipulate the synchronous rectifier;
    wherein the synchronous rectification control circuit further includes a comparator circuit having a general comparing resistor and a comparator unit, wherein a first end of the general comparing resistor is connected to the current transformer for receiving the detecting signal and a second end of the general comparing resistor is connected to an input terminal of the comparator unit, and wherein an output terminal of the comparator unit is connected to a control terminal of the synchronous rectifier, and wherein the comparator circuit is configured to change a level of the synchronous rectification control signal to a disable level when the detecting signal is higher than a reference voltage, thereby manipulating the synchronous rectifier to turn off.

2. The power converter according to claim 1 wherein when the main control circuits manipulates the switching circuit to turn on, the synchronous rectification control circuit manipulates the synchronous rectifier to turn on, and wherein the synchronous rectification control circuit manipulates the synchronous rectifier to turn off according to the detecting signal.

3. The power converter according to claim 1 wherein the comparator unit includes:
    a comparator having an inverting input terminal connected to the second end of the general comparing resistor through the input terminal of the comparator unit and an output terminal connected to the output terminal of the comparator unit and the control terminal of the synchronous rectifier; and
    a voltage source connected in series between a non-inverting input terminal of the comparator and a ground terminal of the comparator unit, and wherein the ground terminal of the comparator circuit is connected to the second common node for providing the reference voltage.

4. The power converter according to claim 1 wherein the comparator unit includes:
    a first auxiliary switch having a control terminal connected to the second end of the comparing resistor through an input terminal of the comparator unit and a first current-conducting terminal connected to the second common node through a ground terminal of the comparator unit, and a second current-conducting terminal connected to the control terminal of the synchronous rectifier through an output terminal of the comparator unit, wherein the turn-on voltage of the first auxiliary switch is equal to the reference voltage.

5. The power converter according to claim 1 wherein the comparator unit includes:
    a second auxiliary switch having a base connected to the control terminal of the synchronous rectifier through the output terminal of the comparator unit and a collector connected to the second end of the general comparing resistor through the input terminal of the comparator unit;
    a third auxiliary switch having a base connected to the collector of the second auxiliary switch and the second end of the general comparing resistor and a collector connected to the control terminal of the synchronous rectifier through the output terminal of the comparator unit, and an emitter connected to the second common node through the ground terminal of the comparator unit;

a first local comparing resistor having a first end connected to an emitter of the second auxiliary switch and a second end connected to the control terminal of the switching circuit for receiving the main control signal; and a second local comparing resistor having a first end connected to the base of the second auxiliary switch, the collector of the third auxiliary switch, and the control terminal of the synchronous rectifier, and a second end connected to the control terminal of the switching circuit for receiving the main control signal;

wherein the turn-on voltage of the third auxiliary switch is equal to the reference voltage.

6. The power converter according to claim 1 wherein the comparing unit includes:

a second auxiliary switch having a base connected to the control terminal of synchronous rectifier through the output terminal of the comparator unit and a collector connected to the second terminal of the general comparing resistor through the input terminal of the comparator unit;

a third auxiliary switch having a base connected to the second terminal of the general comparing resistor and the collector of the second auxiliary switch and a collector connected to the control terminal of the synchronous rectifier through the output terminal of the comparator unit, and an emitter connected to the second common node through a ground terminal of the comparator unit;

a first local comparing resistor having the first terminal connected to the emitter of the second auxiliary switch and the second terminal connected to an auxiliary power for receiving an auxiliary power; and a second local comparing resistor having the first terminal connected to the base of the second auxiliary switch, the collector of the third auxiliary switch, and the control terminal of the synchronous rectifier, and the second terminal connected to the second terminal of the first local comparing resistor for receiving the auxiliary power;

wherein a turn-on voltage of the third auxiliary switch is equal to the reference voltage.

7. The power converter according to claim 1 wherein the synchronous rectification control circuit further includes a startup circuit connected to the control terminal of the switching circuit and the control terminal of the synchronous rectifier for receiving the main control signal and outputting the synchronous rectification control signal to the control terminal of the synchronous rectifier according to the main control signal, and wherein when the level of the synchronous rectification control signal is pulled down, the startup circuit is configured to prohibit the level of the main control signal from being pulled down with the sag of the synchronous rectification control signal.

8. The power converter according to claim 7 wherein the startup circuit includes a startup resistor.

9. The power converter according to claim 7 wherein the startup circuit further includes a totem pole circuit connected between the control terminal of the switching circuit and the startup resistor for reinforcing the driving capability of the power converter.

10. The power converter according to claim 1 wherein the synchronous rectification control circuit further includes a holding circuit connected to the general comparing resistor for receiving the detecting signal and holding a pulse formed when the detecting signal is transitioning from a negative value to a positive value for a predetermined period.

11. The power converter according to claim 10 wherein the holding circuit includes:

a second diode having an anode connected to the second end of the general comparing resistor and a cathode;

a first holding resistor having a first end connected to the cathode of the second diode;

a holding capacitor having a first end connected to a second end of the first holding resistor and a second end connected to the second common node;

a second holding resistor connected in parallel with the holding capacitor and having a first end connected to the second end of the first holding resistor and a second end connected to the second common node.

12. The power converter according to claim 10 wherein the holding circuit includes:

a second diode having an anode connected to the second end of the general comparing resistor and a cathode;

a holding capacitor having the first end connected to the cathode of the second diode and the second end connected to the second common node;

a first holding resistor having the first end connected to the first end of the holding capacitor; and a second holding resistor having the first end connected to the second end of the first holding resistor and the second end connected to the second common node.

13. The power converter according to claim 10 wherein the synchronous rectification control circuit further includes a reset circuit connected to an output terminal of the holding circuit for resetting the holding circuit, thereby allowing the synchronous rectifier to be transitioned from the OFF state to the ON state in the next switching cycle of the switching circuit.

14. The power converter according to claim 13 wherein the reset circuit includes:

a first reset switch having a control terminal connected to the control terminal of the switching circuit for receiving the main control signal and a first current-conducting terminal connected to the second common node and a second current-conducting terminal;

a second reset switch having a control terminal connected to the second current-conducting terminal of the first reset switch and a first current-conducting terminal connected to the second common node and a second current-conducting terminal connected to an output terminal of holding circuit;

a first reset resistor having a first end connected to the second current-conducting terminal of the first reset switch and a second end connected to an auxiliary power for receiving the auxiliary power.

15. The power converter according to claim 13 wherein the reset circuit includes:

a second reset resistor having a first end connected to the control terminal of the switching circuit for receiving the main control signal; and a third reset switch having a control terminal connected to a second end of the second reset resistor and a first current-conducting terminal connected to the second common node and a second current-conducting terminal connected to an output terminal of the holding circuit;

wherein the third reset switch comprises a p-channel MOSFET.

16. The power converter according to claim 13 wherein the reset circuit includes:
- a second reset resistor having the first end connected to the control terminal of the switching circuit for receiving the main control signal; and
- a third reset switch having a control terminal connected to the second end of the second reset resistor and a first current-conducting terminal connected to the second common node and a second current-conducting terminal connected to an output terminal of the holding circuit;
- wherein the third reset switch comprises a n-channel MOSFET.

17. The power converter according to claim 13 wherein the reset circuit includes:
- a diode having a cathode connected to the control terminal of the switching circuit, and an anode connected to the first holding resistor and the second holding resistor.

18. A control method for a synchronous rectifier to control at least one synchronous rectifier of a power converter, wherein the power converter includes a switching circuit, a main control circuit, a transformer, at least one current transformer, and at least one synchronous rectification control circuit, and wherein the switching circuit is connected to a primary winding of the transformer and the main control circuit is connected to the control terminal of the switching circuit, and the current transformer and the synchronous rectifier are connected in series with a secondary winding of the transformer, and the synchronous rectification control circuit is connected to the control terminal of the switching circuit and the control terminal of the synchronous rectifier, the method comprising the steps of:
- outputting a main control signal to the switching circuit and the synchronous rectification control circuit to manipulate the switching circuit, thereby allowing the input energy of the power converter to be transferred across the transformer;
- manipulating the synchronous rectifier to turn on by the synchronous rectification control circuit according to the main control signal;
- detecting a current flowing through the synchronous rectifier by the current transformer and transmitting a detecting signal to the synchronous rectification control circuit; and
- manipulating the synchronous rectifier to turn off by the synchronous rectification control circuit according to the detecting signal;
- wherein the step of manipulating the synchronous rectifier to turn off by the synchronous rectification control circuit according to the detecting signal further includes a comparing process for comparing the detecting signal with a reference voltage by a comparator unit and manipulating the synchronous rectifier to turn off when the level of the detecting signal is higher than the level of the reference voltage.

19. The control method for a synchronous rectifier according to claim 18 wherein the step of manipulating the synchronous rectifier to turn off by the synchronous rectification control circuit according to the detecting signal further includes a holding process for holding a pulse by a holding circuit for a predetermined period, wherein the pulse is formed when the detecting signal is transitioning from a negative value to a positive value.

20. The control method for a synchronous rectifier according to claim 19 wherein the step of manipulating the synchronous rectifier to turn off by the synchronous rectification control circuit according to the detecting signal further includes a resetting process for resetting the holding circuit by a reset circuit, thereby allowing the synchronous rectifier to be transitioned from the OFF state to the ON state in the next switching cycle of the switching circuit.

21. The control method for a synchronous rectifier according to claim 20 wherein the step of manipulating the synchronous rectifier to turn off by the synchronous rectification control circuit according to the detecting signal further includes a startup process for receiving a main control signal outputted from the main control circuit by a startup circuit and outputting a synchronous rectification control signal to the control terminal of the synchronous rectifier according to the main control signal, thereby prohibiting the level of the main control signal from being pulled down with the sag of the level of the synchronous rectification control signal.

* * * * *